(12) United States Patent
Yang

(10) Patent No.: US 9,209,016 B1
(45) Date of Patent: Dec. 8, 2015

(54) COATING METHOD AND COATING SYSTEM

(71) Applicant: MACRONIX International Co., Ltd., Hsinchu (TW)

(72) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 14/513,922

(22) Filed: Oct. 14, 2014

(51) Int. Cl.
*H01L 21/31* (2006.01)
*H01L 21/469* (2006.01)
*H01L 21/02* (2006.01)
*H01L 21/027* (2006.01)
*H01L 21/033* (2006.01)
*H01L 21/67* (2006.01)

(52) U.S. Cl.
CPC ...... *H01L 21/02282* (2013.01); *H01L 21/0271* (2013.01); *H01L 21/02334* (2013.01); *H01L 21/0332* (2013.01); *H01L 21/67098* (2013.01)

(58) Field of Classification Search
USPC .......................................................... 438/758
See application file for complete search history.

(56) References Cited

U.S. PATENT DOCUMENTS

| | | | | |
|---|---|---|---|---|
| 5,736,195 A * | 4/1998 | Haaland | ..................... | B05B 7/00 118/300 |
| 2004/0265503 A1* | 12/2004 | Clayton | ............... | B23K 3/0607 427/446 |
| 2006/0073322 A1* | 4/2006 | Donatti | ................... | B29C 41/08 428/304.4 |
| 2008/0087359 A1* | 4/2008 | Zurecki | ..................... | C23C 4/02 148/511 |
| 2012/0251716 A1* | 10/2012 | Scott | ........................ | E01C 19/21 427/184 |
| 2013/0189443 A1* | 7/2013 | Jiang | ........................ | C23C 24/00 427/475 |
| 2014/0030486 A1* | 1/2014 | Sun | ........................ | H01L 21/02 428/148 |
| 2014/0374014 A1* | 12/2014 | Kim | ........................ | B05D 1/34 156/275.5 |
| 2015/0118773 A1* | 4/2015 | Kojima | ................... | C09K 11/02 438/29 |

* cited by examiner

*Primary Examiner* — Asok K Sarkar
(74) *Attorney, Agent, or Firm* — J.C. Patents

(57) ABSTRACT

A wafer-level coating method and a coating system are provided. A strip-shaped sprayer is disposed above the wafer, and a length of the strip-shaped sprayer is larger than a diameter of the wafer. Then, a coating process is performed by spraying a material from the strip-shaped sprayer to form a material layer covering a top surface of the wafer and moving the strip-shaped sprayer relative to the wafer in a direction vertical to a length direction of the strip-shaped sprayer for at least a distance equal to or larger than the diameter of the wafer. Next, the moving strip-shaped sprayer and the spraying of the material are stopped after the material layer is formed.

19 Claims, 24 Drawing Sheets

COATING METHOD AND COATING SYSTEM

BACKGROUND OF THE INVENTION

1. Field of the Invention

The invention relates to a semiconductor manufacturing process and the processing system thereof, and more particularly relates to a coating method and a coating system.

2. Description of Related Art

As the requirement of high density is greater than before, the structure of the semiconductor devices changes from the planar two-dimensional (2D) layout into the three-dimensional (3D) design. For the 3D semiconductor devices, as the number of the stacked layers keeps increasing, the issue of large step heights occurs.

The conventional spin-coating method commonly encounters troubles in the manufacture of the 3D semiconductor devices with large step heights, as the varying and inconsistent coating leads to inferior critical dimension uniformity (CDU). Accordingly, it is desirable to develop a coating method capable of completing the coating with a more uniform thickness and better coverage over the semiconductor devices.

SUMMARY OF THE INVENTION

The present invention is directed to a coating method, capable of completing the coating with better uniformity and providing a coating layer with well controlled thickness, especially better critical dimension uniformity, even for the semiconductors with large step heights.

The coating method of the invention includes the following. A wafer is provided. A strip-shaped sprayer is provided above the wafer, wherein a length of the strip-shaped sprayer is larger than a diameter of the wafer. Then, a first coating process is performed, wherein a material is sprayed from the strip-shaped sprayer to form a first material layer covering a top surface of the wafer and the strip-shaped sprayer is moved relative to the wafer in a direction vertical to a length direction of the strip-shaped sprayer for at least a distance equal to or larger than the diameter of the wafer. Next, the strip-shaped sprayer moving and the material spraying are stopped after the first material layer is formed.

In an embodiment of the invention, the strip-shaped sprayer comprises a plurality of nozzle columns parallel to one another and each extending in the length direction of the strip-shaped sprayer.

In an embodiment of the invention, each of the nozzle columns comprises nozzles arranged as a column extending in the length direction of the strip-shaped sprayer, and the material is sprayed from the nozzles.

In an embodiment of the invention, the nozzles in different nozzle columns are not aligned to one another in the direction vertical to the length direction of the strip-shaped sprayer.

In an embodiment of the invention, in every two most adjacent nozzle columns, one nozzle column is shifted with a shifting distance relative to the other nozzle column in the length direction of the strip-shaped sprayer.

In an embodiment of the invention, the shifting distance is defined by the following equation: $t=(1/n)*P$, wherein t is the shifting distance, n is a number of the nozzle columns and P is a pitch between every two most adjacent nozzles.

In an embodiment of the invention, the wafer comprises a step structure composed of at least one or more protrusion regions disposed on a flat region, and there is a step height difference between a top surface of the protrusion region and a top surface of the flat region.

In an embodiment of the invention, the first material layer formed by the first coating process includes a slanting coverage portion formed on a side wall of the protrusion region.

In an embodiment of the invention, the transition distance of the slanting coverage portion is defined by the following equation: $T=H*\tan(\theta)$, wherein T is the transition distance of the slanting coverage portion, H is the step height difference of the protrusion region, and $\theta$ is an angle between a side wall of the protrusion region and an edge of a spraying reach of nozzles of the strip-shaped sprayer.

In an embodiment of the invention, a second coating process is performed after the first material layer is formed, to form a second material layer covering a top surface of the first material layer, and the strip-shaped sprayer is stopped after the second material layer is formed.

In an embodiment of the invention, the second coating process includes the following. The strip-shaped sprayer is moved backwards relative to the wafer in the direction vertical to the length direction of the strip-shaped sprayer for at least the distance equal to the diameter of the wafer, to spray a material which forms the second material layer.

In an embodiment of the invention, the first and second coating processes are repeated to form a plurality of material layers.

In an embodiment of the invention, the wafer is rotated a specific degree before the first coating process is performed.

In an embodiment of the invention, the wafer is rotated a first degree before performing the first coating process. Then, the wafer is rotated a second degree after the first material layer is formed. Next, the second coating process is performed.

In an embodiment of the invention, each of the first and second material layers is a photo resist layer, a BARC layer, an ODL layer, a SHB layer or a SOG layer.

In an embodiment of the invention, a baking process is performed after the strip-shaped sprayer is stopped.

In an embodiment of the invention, the baking process includes the following. A strip-shaped baking unit is provided, extending along the direction vertical to the length direction of the strip-shaped sprayer. Then, the strip-shaped baking unit is moved relative to the wafer in the length direction of the strip-shaped sprayer to bake the material layer. Next, the strip-shaped baking unit is stopped after moving for at least the distance equal to the diameter of the wafer.

In an embodiment of the invention, the coating process and the baking process are in-situ performed.

In an embodiment of the invention, an excess material is removed after the strip-shaped sprayer is stopped.

The invention further provides a coating system including a chamber, a supporting unit, strip-shaped sprayer, and a strip-shaped baking unit. A wafer is to be loaded in the chamber and supported by a supporting unit. The strip-shaped sprayer is disposed in the chamber and above the wafer, for spraying a material and coating over a top surface of the wafer by moving the—strip-shaped sprayer relative to the wafer in a direction vertical to a length direction of the strip-shaped sprayer for at least a distance equal to a diameter of the wafer. A length of the strip-shaped sprayer is larger than the diameter of the wafer. The strip-shaped baking unit is disposed in the chamber, above the wafer and vertical to the strip-shaped sprayer, for baking the material layer coated on the wafer.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 6A-FIG. 6I are schematic view showing a coating method according to yet another embodiment of the invention, wherein FIG. 6A and FIG. 6F are schematic top views, and FIG. 6B-FIG. 6E and FIG. 6G-FIG. 6I are schematic cross-sectional views.

DESCRIPTION OF THE EMBODIMENTS

Figure 1A:
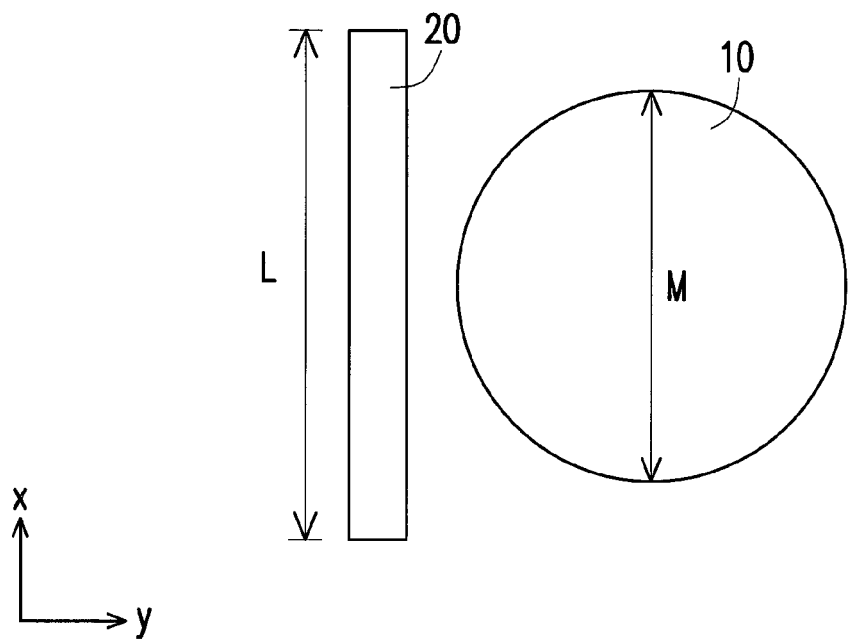
FIG. 1A-FIG. 1D are schematic top views showing the process steps of the coating method according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

FIG. 1A-FIG. 1D are schematic top views showing the process steps of the coating method according to an embodiment of the invention. FIG. 2A-FIG. 2D are schematic cross-sectional views of the process steps of the coating method as shown in FIG. 1A-FIG. 1D. FIG. 3 is an enlarged and schematic three-dimensional view of a strip-shaped sprayer according to an embodiment of the invention.

Figure 2A:
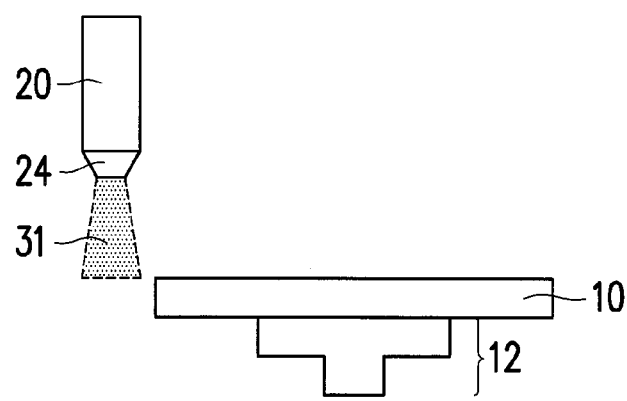
FIG. 2A-FIG. 2D are schematic cross-sectional views of the process steps of the coating method as shown in FIG. 1A-FIG. 1D.
Figure 3:
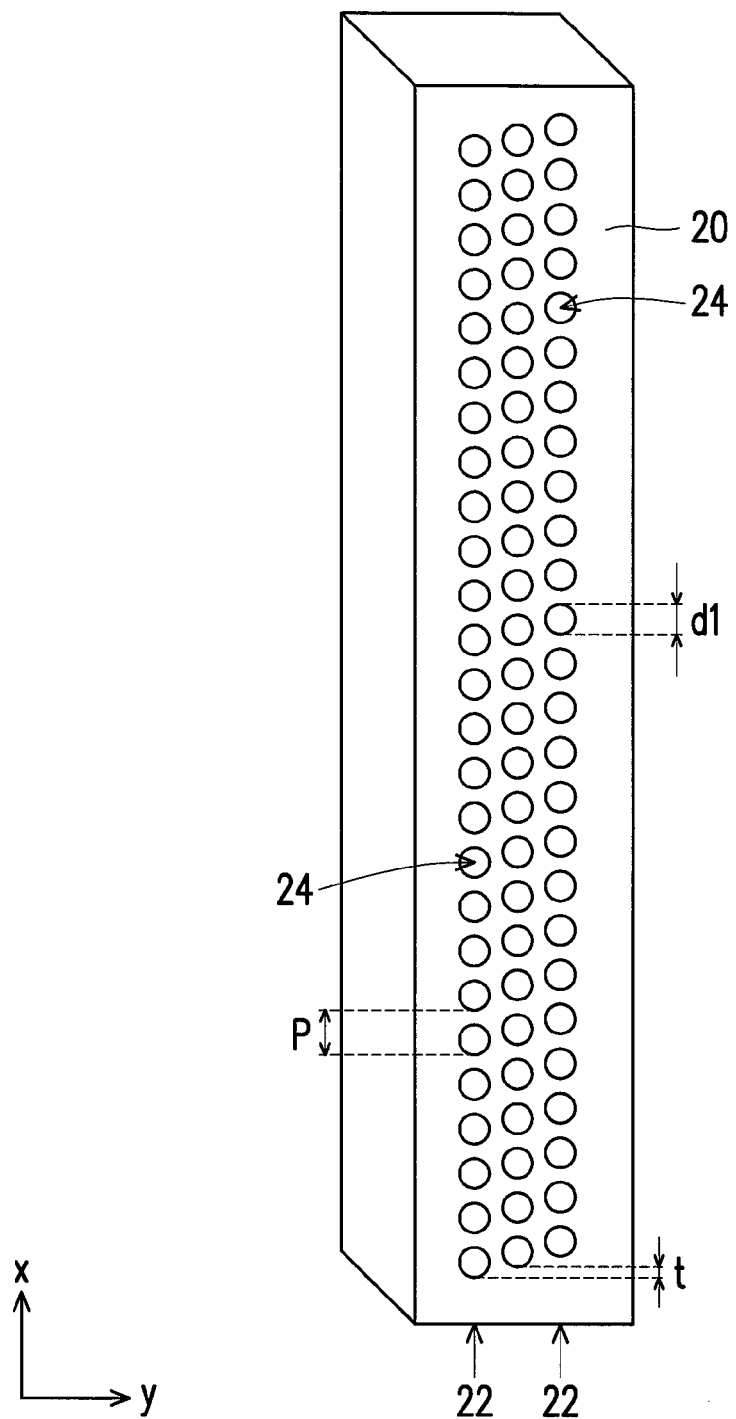
FIG. 3 is an enlarged and schematic three-dimensional view of a strip-shaped sprayer according to an embodiment of the invention.

With reference to FIG. 1A and FIG. 2A, a substrate or a wafer 10 is provided. The wafer 10, also referred as a substrate, may be a bare wafer or a wafer having a base material layer already formed thereon. The substrate may be a semiconductor substrate or a semiconductor-on-insulator (SOI) substrate, for example. The semiconductor substrate may be composed of IVA compounds (such as silicon, germanium, silicon carbide or silicon germanium) or III-V semiconductor compounds (such as gallium arsenide), for example. The base material layer may be composed of a single material, or a stacked structure formed by stacking two or more materials. In an embodiment, the base material layer includes a stacked structure of silicon oxide layers and poly-Si layers.

With reference to FIG. 1A and FIG. 2A, a strip-shaped sprayer 20 is disposed above the wafer 10. A length L of the strip-shaped sprayer 20 is larger than a diameter M of the wafer 10. With reference to FIG. 3, the strip-shaped sprayer 20 comprises a plurality of nozzle columns 22 parallel to one another and each extending in a length direction x of the strip-shaped sprayer 20. Each of the plurality of the nozzle columns 22 comprises a plurality of nozzles 24 arranged as a column in the x direction. In general, all the nozzles 24 have the same diameter d1, but the diameter d1 may be adjusted according to the process conditions or product requirements. The nozzles 24 are evenly distributed in each nozzle column 22, in other words, a pitch P between every two most adjacent nozzles 24 is constant.

With reference to FIG. 3, the locations of the nozzles 24 in one nozzle columns 22 are not exactly aligned with the locations of the nozzles 24 in the next column in the y direction (the y direction is vertical to the length direction x of the strip-shaped sprayer 20). More particularly, as for every two most adjacent nozzle columns 22, the locations of the nozzles 24 in one nozzle column 22 is shifted with a shifting distance t relative to the locations of the nozzles 24 in the next nozzle column 24 in the x direction of the strip-shaped sprayer 20. If the number (amount) of the nozzle columns is n, the shifting distance t is defined by the equation: $t=(1/n)*P$. In addition, as the nozzle columns 22 are shifted towards the same end of the strip-shaped sprayer 20, the locations of the nozzles 24 in different nozzle columns may be staggered, partially staggered, partially overlapped but are certainly not fully aligned with one another in the length direction x. In an embodiment, as shown in FIG. 3, only three nozzle columns 22 are described, the shifting distance t is defined as $(1/3)*P=\frac{1}{3}P$. Hence, as for every two most adjacent nozzle columns 22 in FIG. 3, one nozzle column 22 is shifted for ⅓ P relative to the next nozzle column 22 in the length direction x of the strip-shaped sprayer 20. However, the number of the nozzle columns or the number of the nozzles 24 in FIG. 3 is for illustrative purpose only, and the invention is not limited thereto.

Figure 1B:
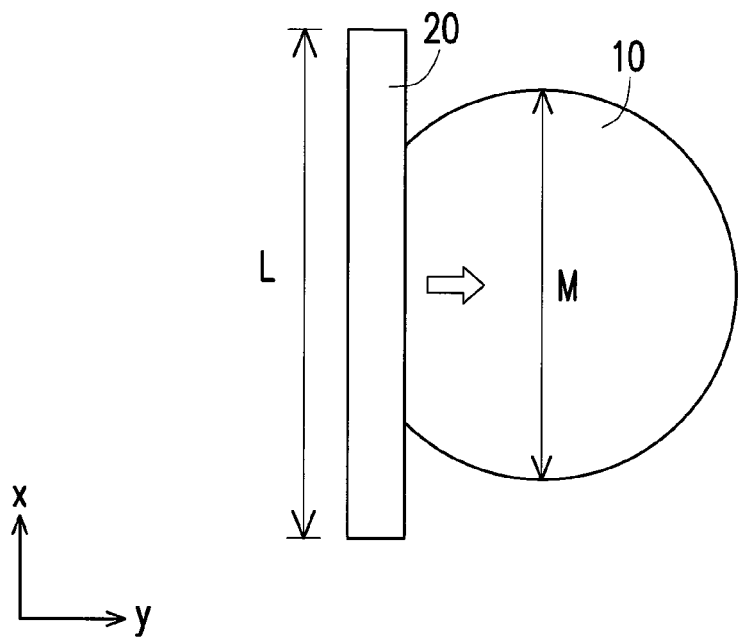
Figure 2B:
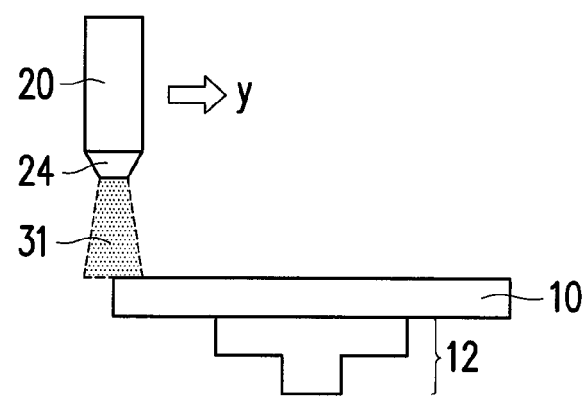
Figure 1C:
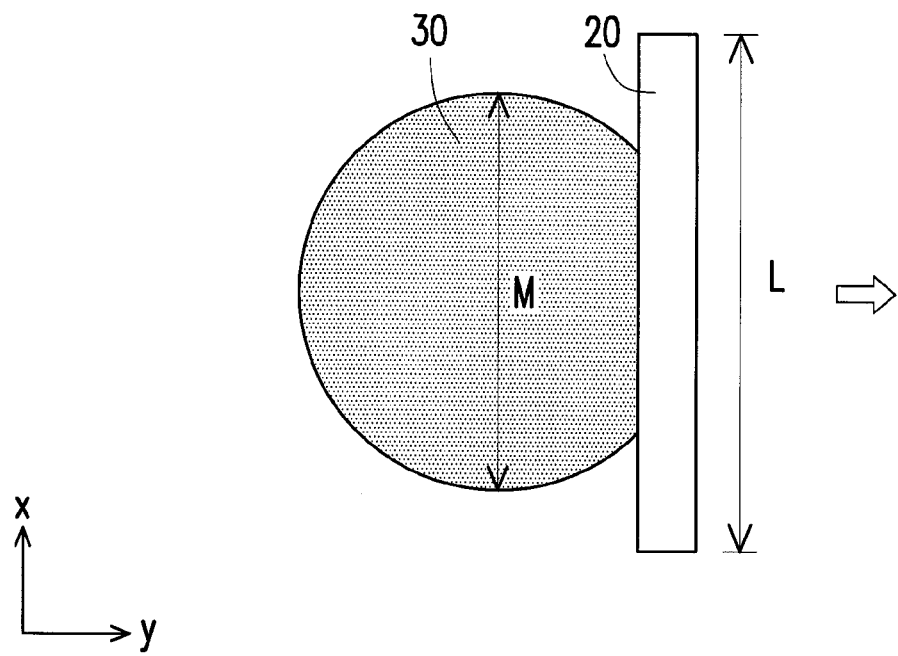
Figure 2C:
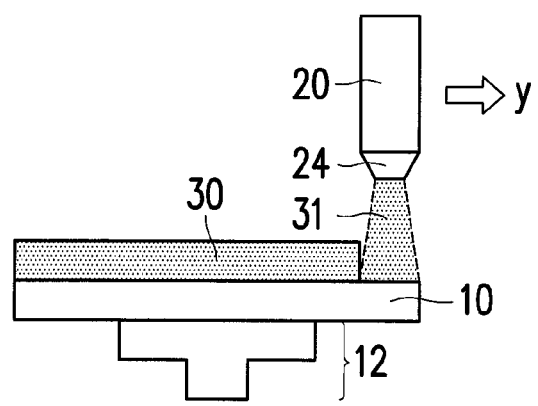
Figure 1D:
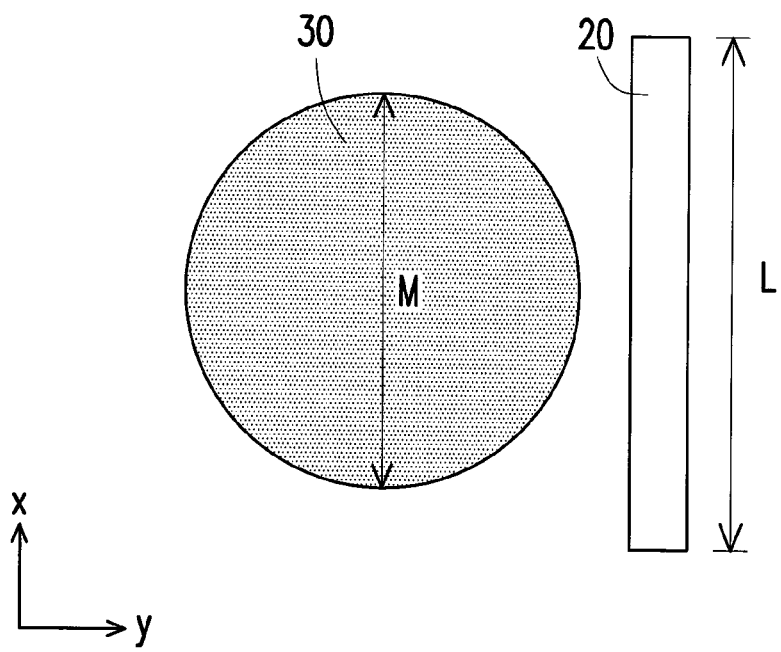
Figure 2D:
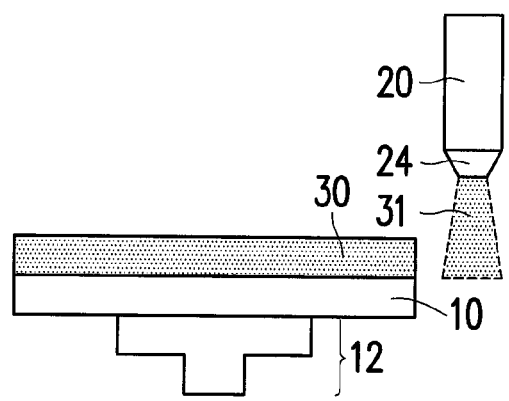

Referring to FIG. 1B and FIG. 2B, a material 31 is sprayed from the strip-shaped sprayer 20 and the strip-shaped sprayer 20 is moved relative to the wafer 10 in the y direction, in order to form a material layer 30 covering a top surface of the wafer 10. In the moving process of the strip-shaped sprayer 20, as shown in FIG. 1C and FIG. 2C, the strip-shaped sprayer 20 sprays the material 31 simultaneously and the material 31 is evenly coated on the top surface of the wafer 10. Referring to FIG. 1D and FIG. 2D, after the strip-shaped sprayer 20 is moved for at least a distance equal to or larger than the diameter M of the wafer 10 and the formation of the material layer 30 is completed, the strip-shaped sprayer 20 is stopped. The length L of the strip-shaped sprayer 20 is larger than the diameter M of the wafer 10, so the top surface of the wafer 10 can be fully covered by the material layer 30. Besides, the nozzles 24 in different nozzle columns 22 of the strip-shaped sprayer 20 are not aligned to each other, so the uniformity of the coated material layer 30 is enhanced. In addition, the overall thickness of the material layer 30 can be adjusted by changing the moving speed of the strip-shaped sprayer 20. That is, when the strip-shaped sprayer 20 moves faster, the material layer 30 becomes thinner; when the strip-shaped sprayer 20 moves slower, the material layer 30 becomes thicker.

The material layer 30 may be a photo resist layer, a BARC (bottom anti-reflective coating) layer, an ODL (organic under layer) layer, a SHB (silicon-containing hard-mask bottom anti-reflection coating) layer or a SOG (spin-on-glass) layer. The photo resist layer is formed by a photo resist material, and the photo resist material can be a positive photo resist or a negative photo resist. The photo resists material is, for example, a photosensitive material comprising resin, photosensitive agent and solvent. The materials of the BARC layer and SHB layer may be organosilicon polymers or polysilane. A material of the ODL layer may be an organic under material, a carbon-containing dielectric material or a carbon oxide-containing dielectric material. A material of the SOG layer may be silicon dioxide ($SiO_2$).

FIG. 4A-FIG. 4E are schematic cross-sectional views showing a coating process according to an embodiment of the invention.

With reference to FIG. 4A-FIG. 4E, the substrate or the wafer 10 may includes a step structure 50 after the repeated deposition or the formation of one or more base material layers. The step structure 50 includes at least one or more protrusion regions 16 disposed on a flat region 14 and there is a step height difference H between a top surface 16a of the protrusion region 16 and a top surface 14a of the flat region 14. Only two protrusion regions 16 in FIG. 4A-FIG. 4E are shown for illustrative purpose, but the invention is not limited thereto. In addition, the step height difference H in FIG. 4A-FIG. 4E is exaggerated for clarity and illustration, thus may not corresponding to the real proportion, while still falling within the spirit of the embodiments of the invention. Besides, there is a concave region 15 between two adjacent protrusion regions 16, defined by the side walls of the protrusion regions 16 and a top surface of the flat region 14 which is not covered by the protrusion regions 16.

Figure 4A:
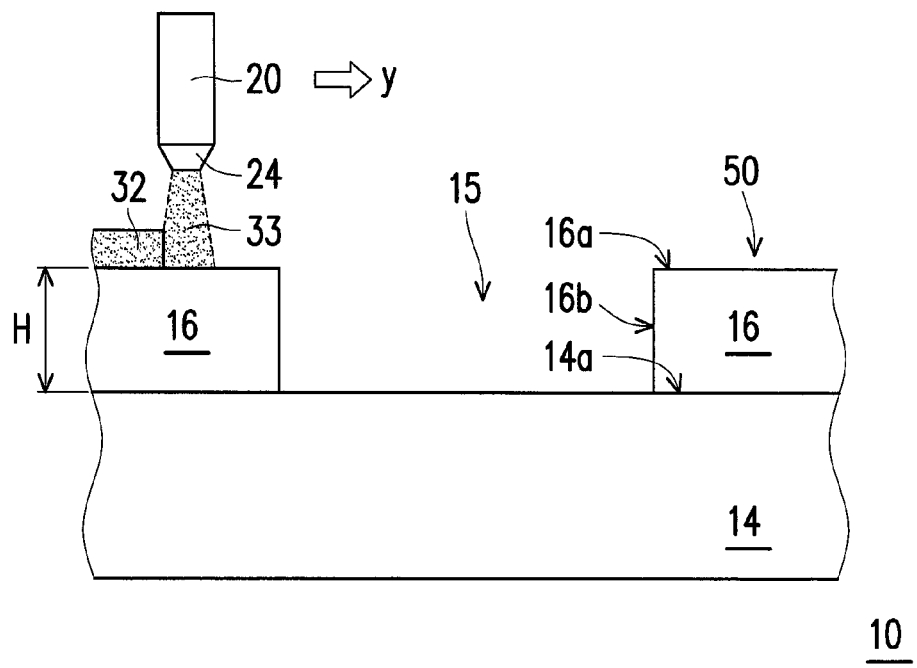
FIG. 4A-FIG. 4E are schematic cross-sectional views showing a coating process according to an embodiment of the invention.
Figure 4B:
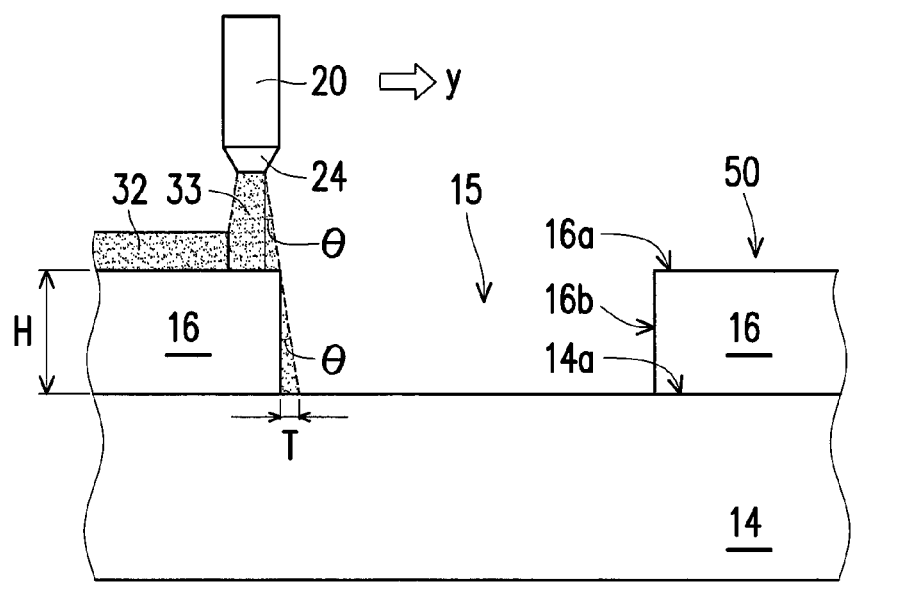
Figure 4C:
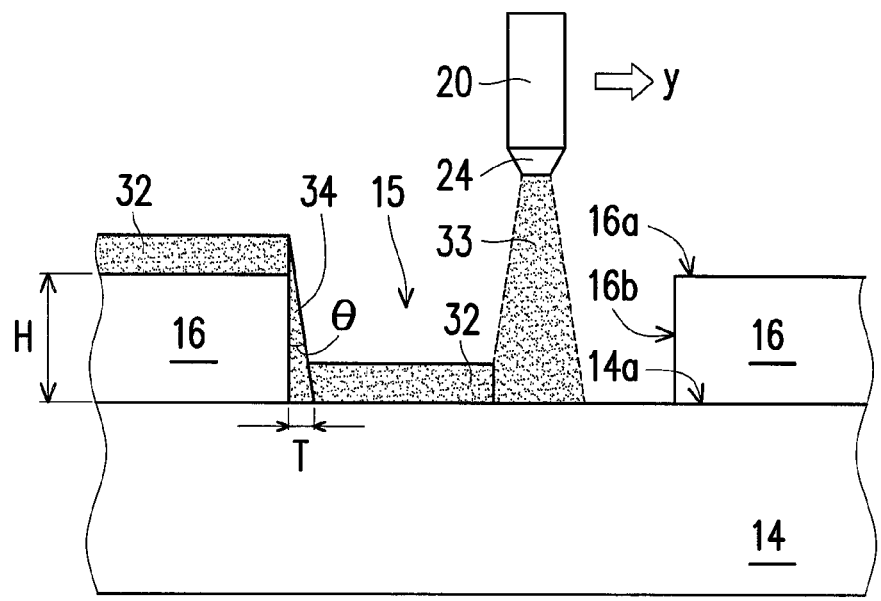
Figure 4D:
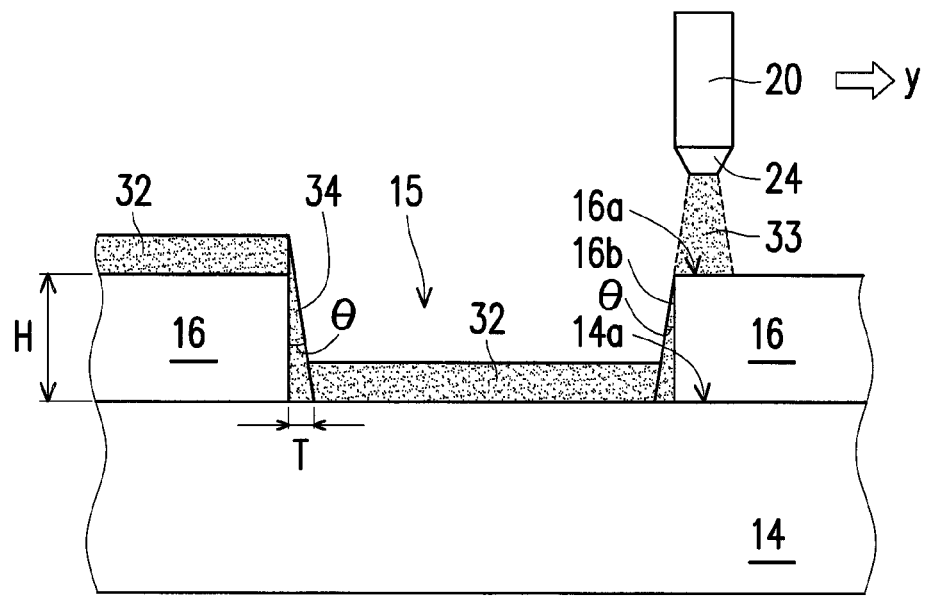
Figure 4E:
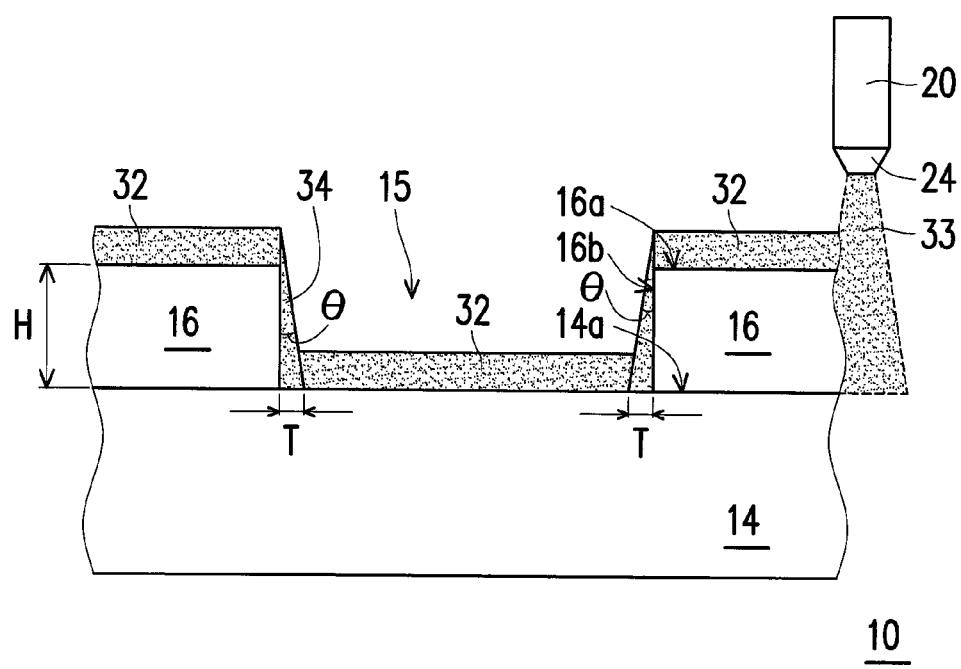

With reference to FIG. 4A-FIG. 4E, a coating process is performed over the step structure 50 by moving the strip-shaped sprayer 20 in the y direction (shown as the arrow) and simultaneously spraying the material 33 from the nozzles 24 of the strip-shaped sprayer 20. In FIG. 4A, as the strip-shaped sprayer 20 moves across (in the y direction), the material 33 is uniformly spray-coated on the top surface 16a of the protrusion region 16 to form a material layer 32. The material layer 32 may be a photo resist layer, a BARC (bottom anti-reflective coating) layer, ODL (organic under layer) layer, SHB (silicon-containing hard-mask bottom anti-reflection coating) layers or SOG (spin-on-glass) layers. As shown in FIG. 4B, when the strip-shaped sprayer 20 moves approaching the concave region 15, once the spraying range of the strip-shaped sprayer 20 reaches beyond the edge between the protrusion region 16 and the flat region 14, tilted spray coating with an angle θ may occur in the region with a step height difference H. The spraying range of the spraying nozzle 24 is supposed to be in a cone shape (e.g. the right circular cone with an aperture 20). Following the tilted spray coating with the angle θ, a slanting coverage portion 34 made from the material 33 is formed on a side wall 16b of the protrusion region 16. The slanting coverage portion 34 may be viewed as a right angled triangle in the cross-sectional view of FIG. 4B, and a transition distance T of the slanting coverage portion 34 may be defined by the step height difference H and the angle θ as T=H*tan(θ). For example, by controlling the angle θ to be less than 10° for the coating method of the present invention, it is possible to control the transition distance T of the slanting coverage portion 34 of the material layer 32 to be less than 0.25 microns. Compared to the large transition distance (>20 microns) using the conventional spin coating method for coating a material layer over the step structure, the coating method of the invention is obviously superior in either the coating uniformity or the coating conformality. After the slanting coverage portion 34 is formed, the strip-shaped sprayer 20 moves in the y direction towards another protrusion region 16, as shown in FIG. 4C. When the strip-shaped sprayer 20 moves across the top surface of the flat region 14 which is not covered by the protrusion regions 16, the material layer 32 is formed thereon. As shown in FIG. 4D, similarly, once the spraying range of the strip-shaped sprayer 20 reaches beyond the edge between the flat region 14 and another protrusion region 16, tilted spray coating with the angle θ may occur. Following the tilted spray coating with the angle θ, another slanting coverage portion 34 is formed on the side wall 16b of another protrusion region 16. After another slanting coverage portion 34 is formed, as shown in FIG. 4E, the strip-shaped sprayer 20 moves across another protrusion region 16, and the material layer 32 is formed thereon.

Figure 5A:
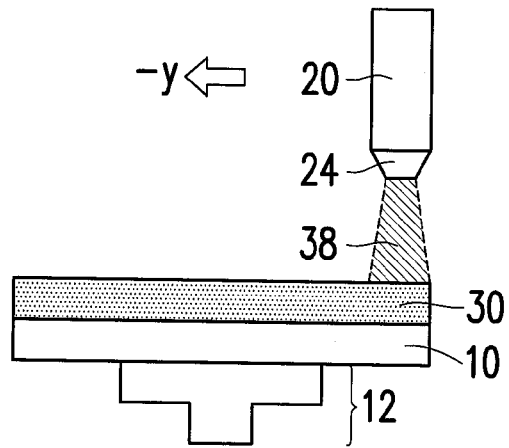
FIG. 5A-FIG. 5C are schematic cross-sectional views showing a coating method according to another embodiment of the invention.
Figure 5B:
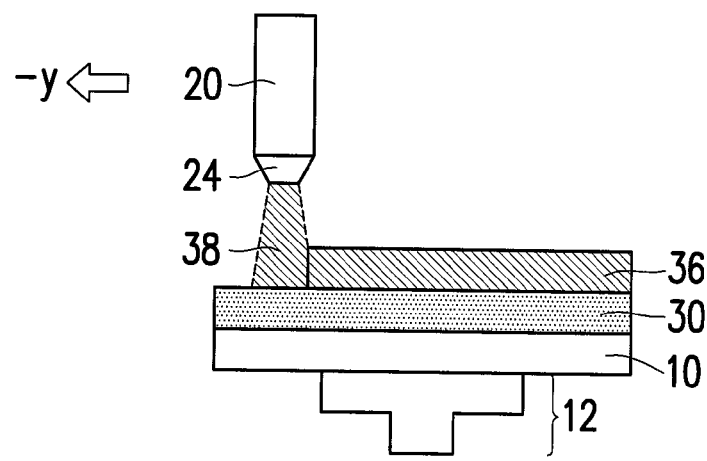
Figure 5C:
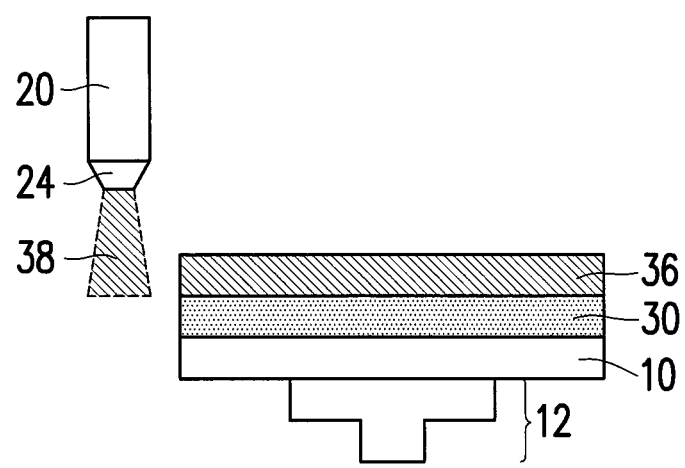

FIG. 5A-FIG. 5C are schematic cross-sectional views showing a coating method according to another embodiment of the invention. The fabricating process of FIG. 5A to FIG. 5C is similar to the aforementioned process. Therefore, identical components/elements are represented by the same reference numerals, and the following paragraphs only describe the difference. Besides, the material layers 30 and 36 in FIG. 5A-FIG. 5C are not necessarily formed over flat surfaces and may be formed over the substrate or wafer with one or more step structures. However, the material layers with planar profile are shown for illustrative purposes, but the scope of the invention is not limited thereto.

With reference to FIG. 2A-FIG. 2D, the formation of the material layer 30 is completed. According to another embodiment of the invention, referring to FIG. 5A-FIG. 5C, after the material layer 30 is formed, the material layer 36 is evenly coated on a top surface of the material layer 30. More particularly, as shown in FIG. 5A-FIG. 5B, the strip-shaped sprayer 20 is moved relative to the wafer 10 in the −y direction, and a material 38 is sprayed simultaneously, in order to form the material layer 36 fully covering the top surface of the material layer 30. Referring to FIG. 5C, the strip-shaped sprayer 20 is stopped after moving for at least the distance equal to or larger than the diameter M of the wafer 10, and the formation of the material layer 36 fully covering the top surface of the material layer 30 is completed. The material layer 36 may be a photo resist layer, a BARC layer, an ODL layer, a SHB layer or a SOG layer. However, the material 31 of the material layer 30 is different from the material 38 of the material layer 36. In addition, more material layers may be formed by repeating the coating method illustrated in FIG. 2A-FIG. 2D and FIG. 5A-FIG. 5C.

Figure 6A:
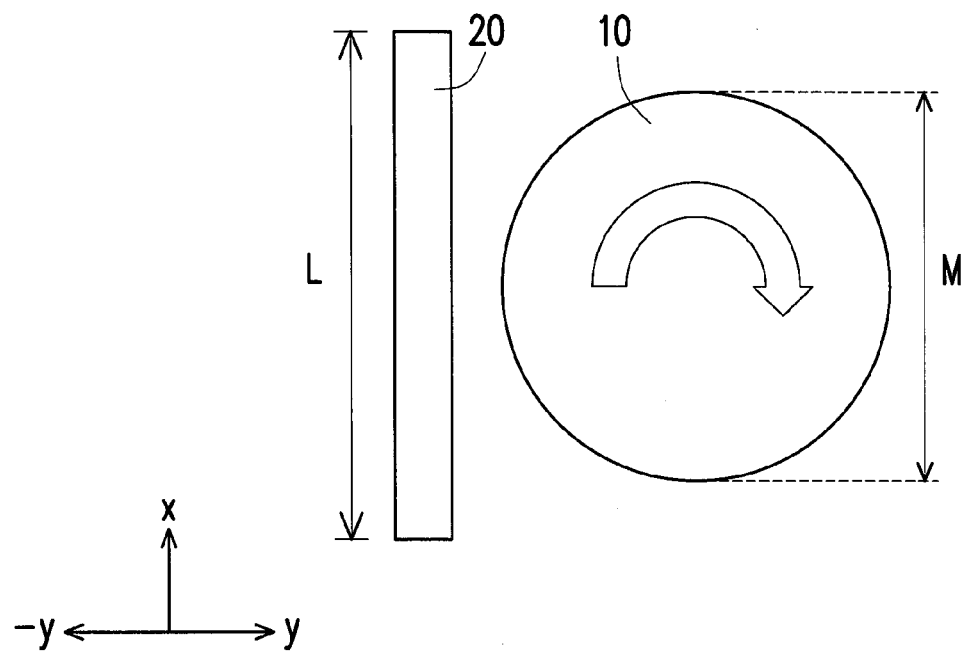
Figure 6B:
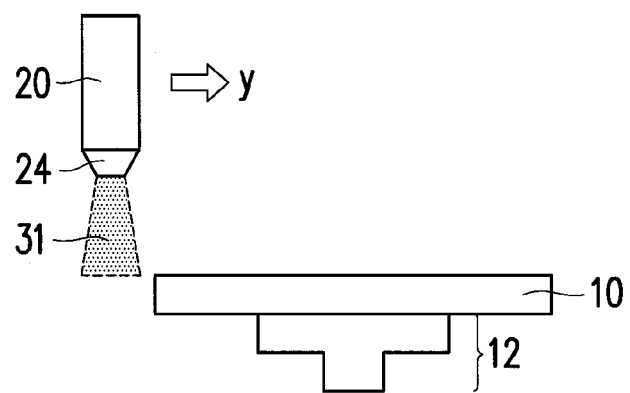
Figure 6C:
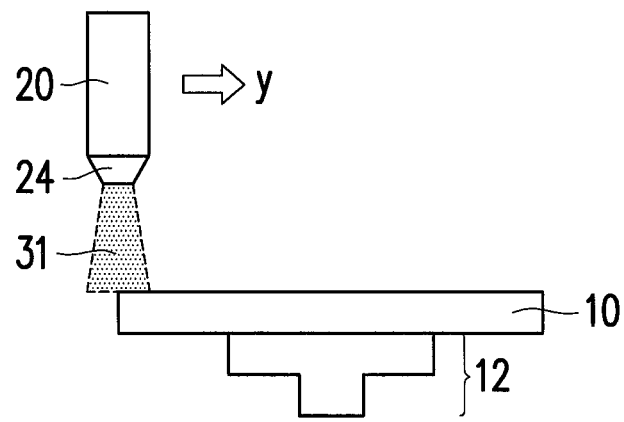
Figure 6D:
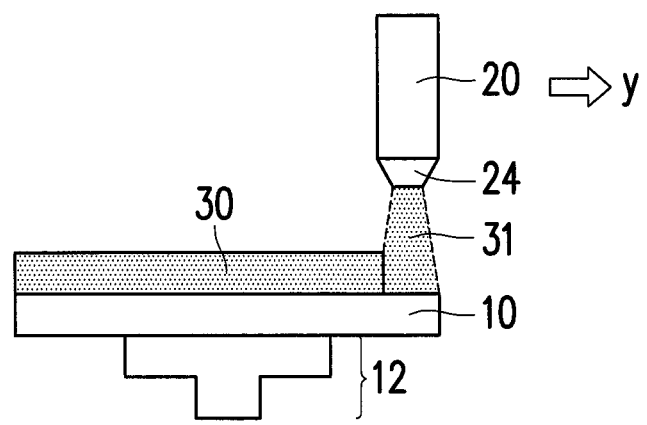
Figure 6E:
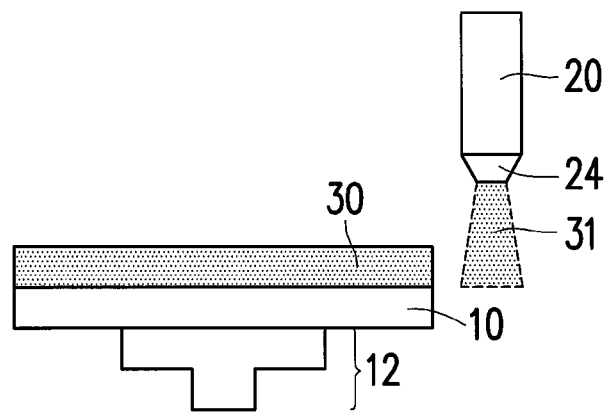
Figure 6F:
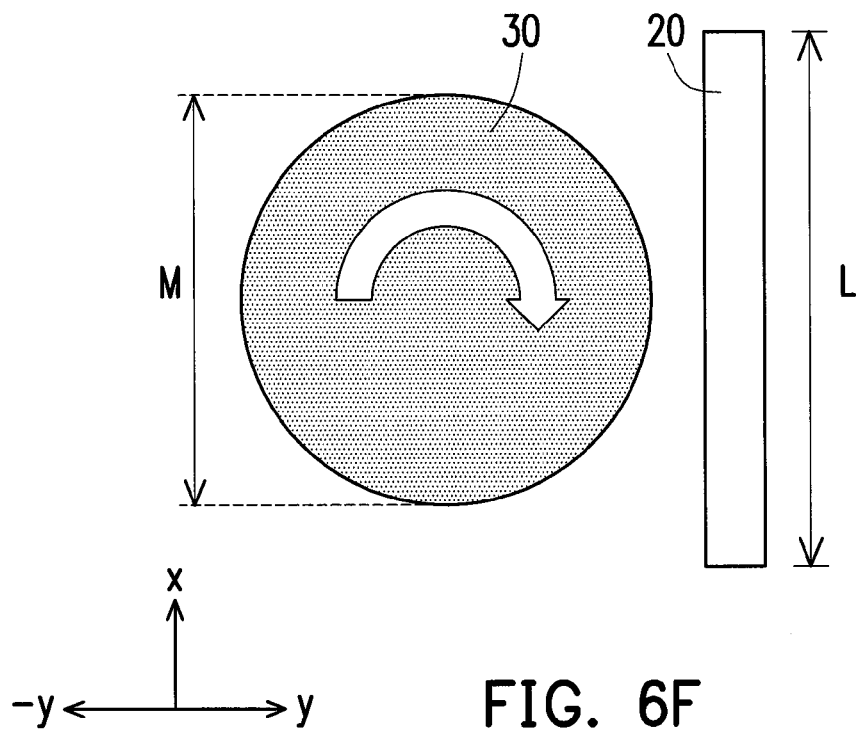

FIG. 6A-FIG. 6I are schematic view showing a coating method according to yet another embodiment of the invention, wherein FIG. 6A and FIG. 6F are schematic top views, and FIG. 6B-FIG. 6E and FIG. 6G-FIG. 6I are schematic cross-sectional views. The fabricating process of FIG. 6A-FIG. 6I is similar to the aforementioned process. Therefore, identical components/elements are represented by the same reference numerals, and only the difference in the process will be described in the following paragraphs. Besides, the material layers 30 and 36 in FIG. 6D-FIG. 6I are not necessarily formed over flat surfaces and may be formed over the substrate or wafer with one or more step structures. However, the material layers with planar profile are shown for illustrative purposes, but the scope of the invention is not limited thereto.

Figure 6G:
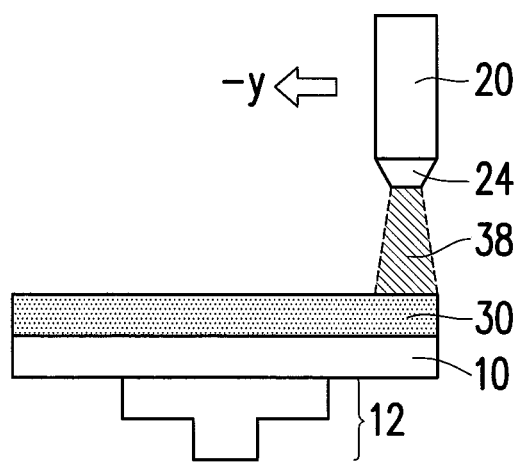
Figure 6H:
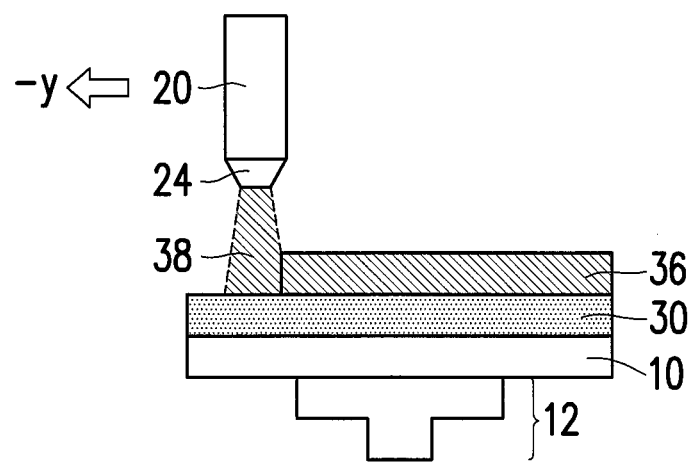
Figure 6I:
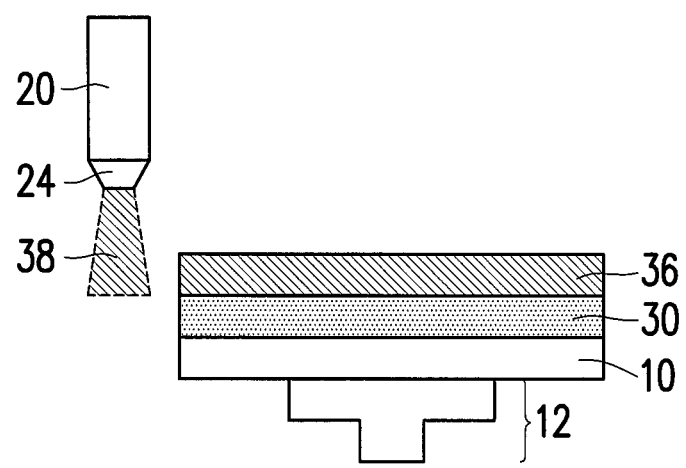

According to yet another embodiment of the invention, as shown in FIG. 6A, the wafer 10 may be rotated a specific degree from a starting point before the formation of the material layer 30. Referring to FIG. 6B-FIG. 6E, the strip-shaped sprayer 20 is moved relative to the wafer 10 in the y direction for at least the distance equal to or larger than the diameter M of the wafer 10, to spray the material 31 which forms the material layer 30 fully covering the top surface of the wafer 10. As shown in FIG. 6F, the wafer 10 fully coated by the material layer 30 may be rotated another specific degree from the previous position after the coating of material layer 30. Afterwards, as shown in FIG. 6G-FIG. 6I, the strip-shaped sprayer 20 is moved relative to the wafer 10 in the −y direction for at least the distance equal to or larger than the diameter M of the wafer 10, to spray a material 38 which forms the material layer 36 fully covering the top surface of the material layer 30. The evenness and thickness uniformity of the coated material layer can be well controlled by rotating the wafer 10 before performing the coating method, especially when the step structure exists.

Furthermore, according to an embodiment, after a material layer is coated by the coating method of the invention, an excess material may exist in an edge of the material layer (not illustrated). Hence, a removing step may be performed to remove the excess material. The removing step may be edge bead rinse method or edge bevel removal method, for example.

Figure 7:
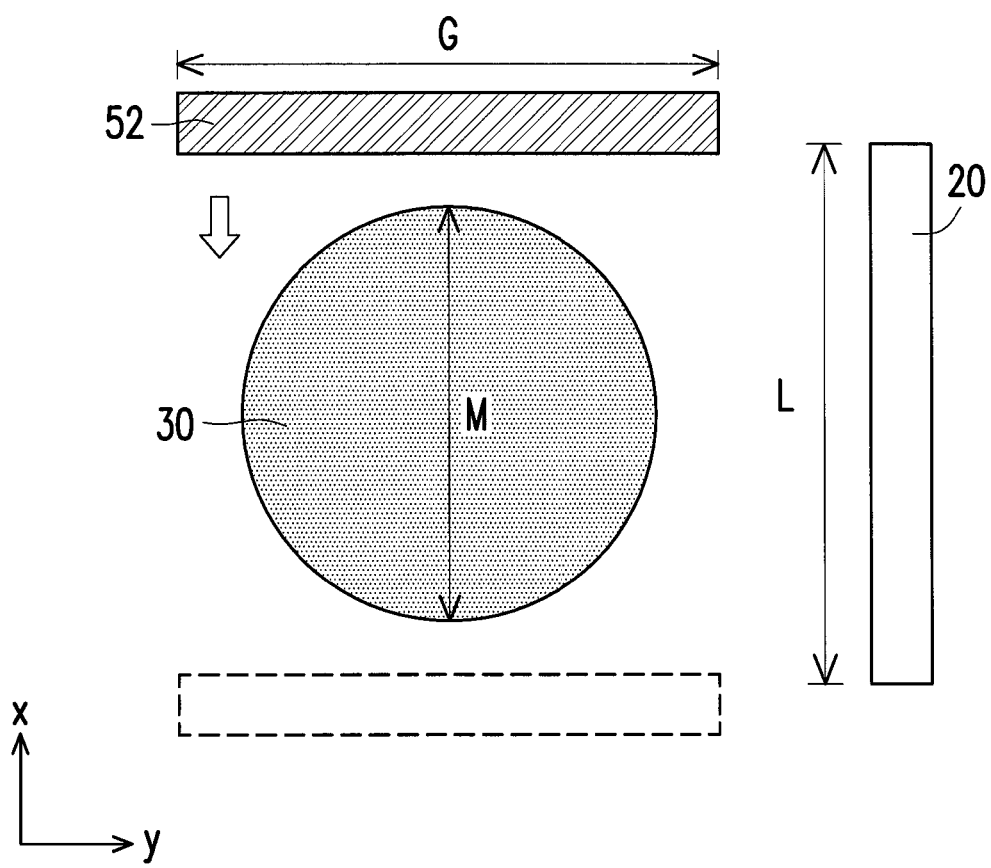
FIG. 7 is a schematic top view showing a baking process according to an embodiment of the invention.

FIG. 7 is a schematic top view showing a baking process according to an embodiment of the invention.

With reference to FIG. 1A-FIG. 1D after the material layer 30 is coated over the wafer, according to an embodiment of the invention, a baking process may be performed in the same chamber (in-situ) as seen in FIG. 7. The detail of the baking process is described as follows. First, a strip-shaped baking unit 52 extending along the y direction is disposed above the wafer 10 and then moved relative to the wafer 10 in the length direction x of the strip-shaped sprayer 20 to bake the material layer 30. The strip-shaped baking unit 52 may be an infrared light source, for example. After the strip-shaped baking unit 52 is moved for at least the distance equal to or larger than the diameter M of the wafer 10, the strip-shaped baking unit 52 is stopped. It is worthy to note that, the coating method and the baking process may be performed in sequence and performed in-situ. In addition, the baking process can also be incorporated into the coating process illustrated in FIG. 5A-FIG. 5C and FIG. 6A-FIG. 6I.

Figure 8A:
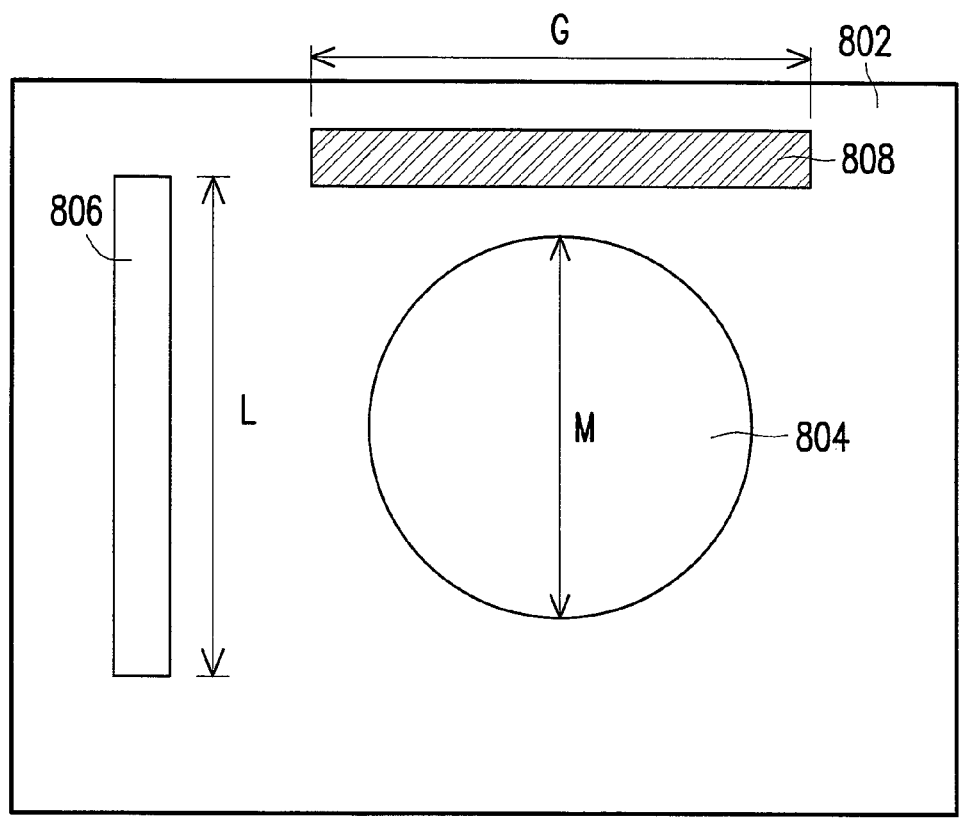
FIG. 8A is a schematic top views showing a coating system according to a first embodiment of the invention.
Figure 8B:
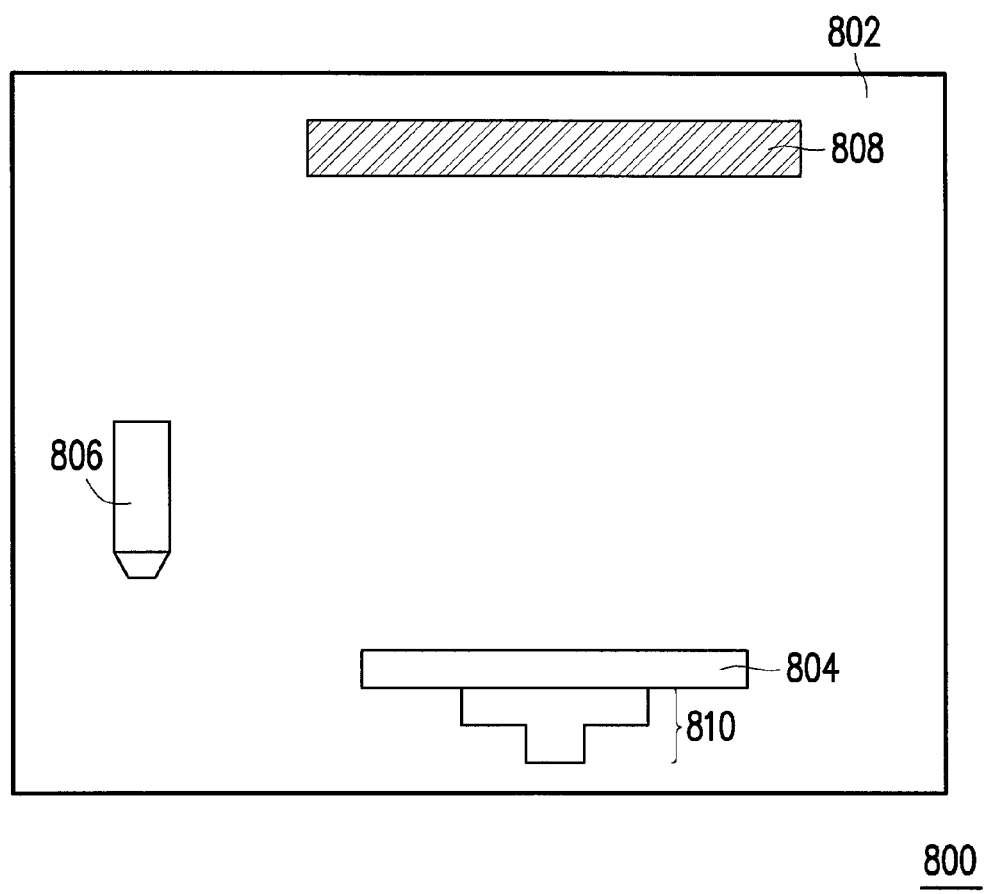
FIG. 8B is a schematic cross-sectional view of FIG. 8A.

FIG. 8A is a schematic top view showing a coating system according to a first embodiment of the invention, and FIG. 8B is a schematic cross-sectional view of FIG. 8A.

With reference to FIG. 8A and FIG. 8B, according to the first embodiment of the present invention, a coating system 800 is provided. The coating system 800 includes a chamber 802, and a wafer 804 is disposed therein. The wafer 804 is supported by a supporting unit 810. The wafer 804, also referred as a substrate, may be a bare wafer or a wafer having a base material layer already formed thereon. The substrate may be a semiconductor substrate or a semiconductor-on-insulator (SOI) substrate, for example. The semiconductor substrate may be composed of IVA compounds (such as silicon, germanium, silicon carbide or silicon germanium) or III-V semiconductor compounds (such as gallium arsenide), for example. The base material layer may be composed of a single material, or a stacked structure formed by stacking two or more materials. In an embodiment, the base material layer includes a stacked structure of silicon oxide layers and poly-Si layers.

With reference to FIG. 8A and FIG. 8B, a strip-shaped sprayer 806 and a strip-shaped baking unit 808 are disposed above the wafer 804 in the chamber 802. The strip-shaped sprayer 806 is used to spray a material and coat a material layer (not illustrated) over the wafer 804 according to the coating method of the above embodiment of the invention. The material layer may be a photo resist layer, a BARC layer, an ODL layer, a SHB layer or a SOG layer. The strip-shaped baking unit 808 is disposed vertical to the strip-shaped sprayer 806 and used to bake the material layer coated on the wafer 804 according to the baking process of the above embodiment of the invention. The strip-shaped baking unit 808 may be an infrared light source, for example. In addition, the length L of the strip-shaped sprayer 806 and the length G of the strip-shaped baking unit 808 are larger than a diameter M of the wafer 804. In the coating system 800, the coating process and the baking process can be in-situ performed (in the same chamber). The coating process and the baking process may be performed in sequence or in a specific order.

Figure 9A:
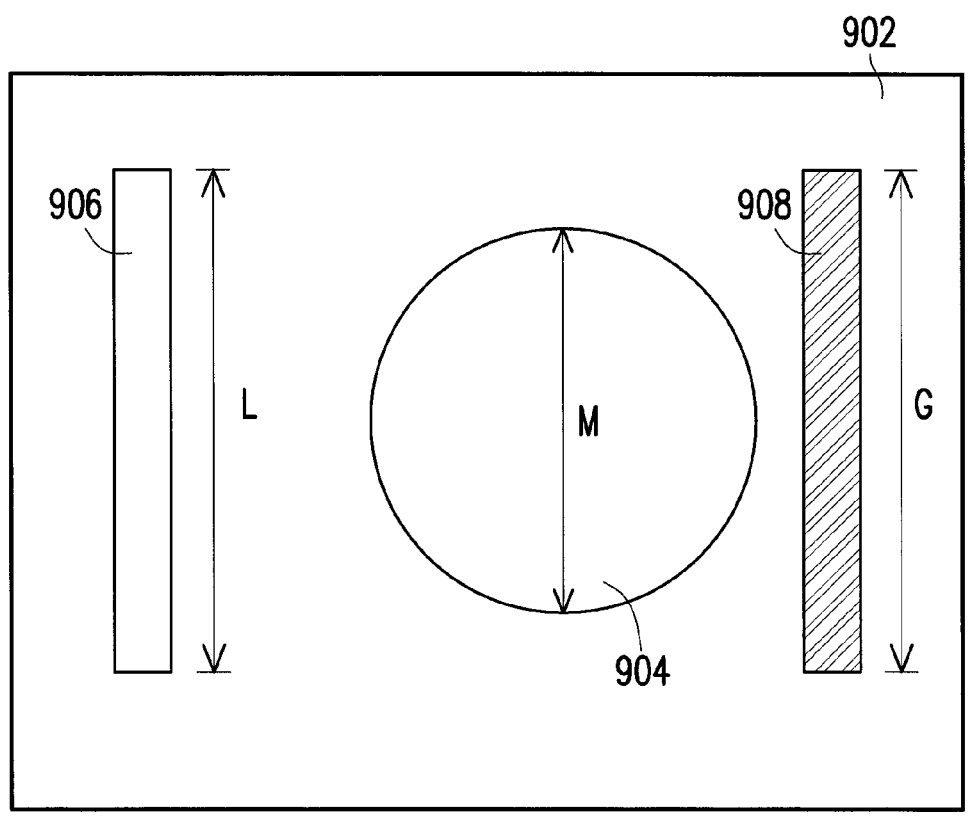
FIG. 9A is a schematic top views showing a coating system according to a second embodiment of the invention.
Figure 9B:
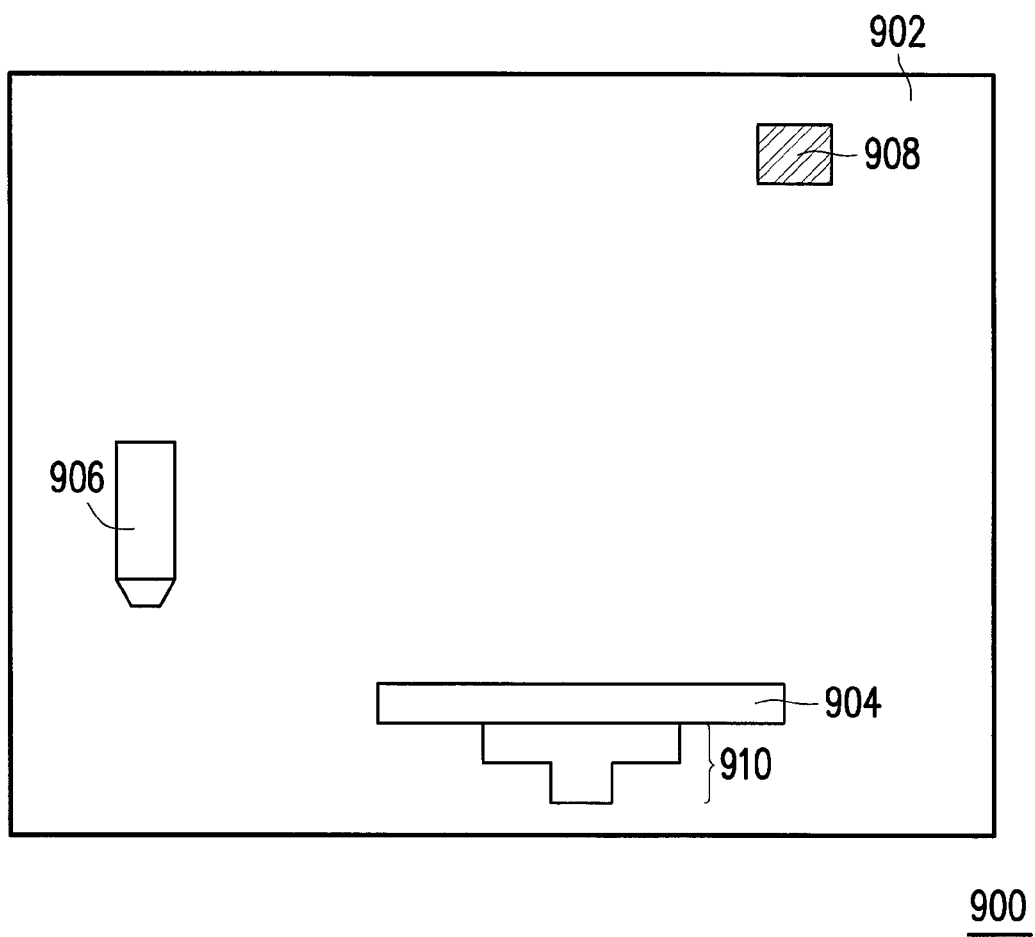
FIG. 9B is a schematic cross-sectional view of FIG. 9A.

FIG. 9A is a schematic top views showing a coating system according to a second embodiment of the invention, and FIG. 9B is a schematic cross-sectional view of FIG. 9A.

With reference to FIG. 9A and FIG. 9B, according to the second embodiment of the present invention, a coating system 900 is provided. The coating system 900 includes a chamber 902, and a wafer 904 is disposed therein. The wafer 904, also referred as a substrate, is supported by a supporting unit 910. As shown in FIG. 9A and FIG. 9B, a strip-shaped sprayer 906 and a strip-shaped baking unit 908 are disposed above the wafer 904 in the chamber 902. In addition, the strip-shaped baking unit 908 is disposed higher than the strip-shaped sprayer 906. The strip-shaped sprayer 906 is used to spray a material and coat a material layer (not illustrated) over the wafer 904. The material layer may be a photo resist layer, a BARC layer, an ODL layer, a SHB layer or a SOG layer. The strip-shaped baking unit 908 is used to bake the material layer coated on the wafer 904. The strip-shaped baking unit 908 may be an infrared light source, for example. More particularly, the strip-shaped baking unit 908 and the strip-shaped sprayer 906 are disposed at opposite sides of the wafer 904 and arranged parallel to each other. In addition, the length L of the strip-shaped sprayer 906 and the length G of the strip-shaped baking unit 908 are larger than a diameter M of the wafer 904. In the coating system 900, the coating process and the baking process can be in-situ performed (in the same chamber). The coating process and the baking process may be performed in sequence or in a specific order.

Figure 10A:
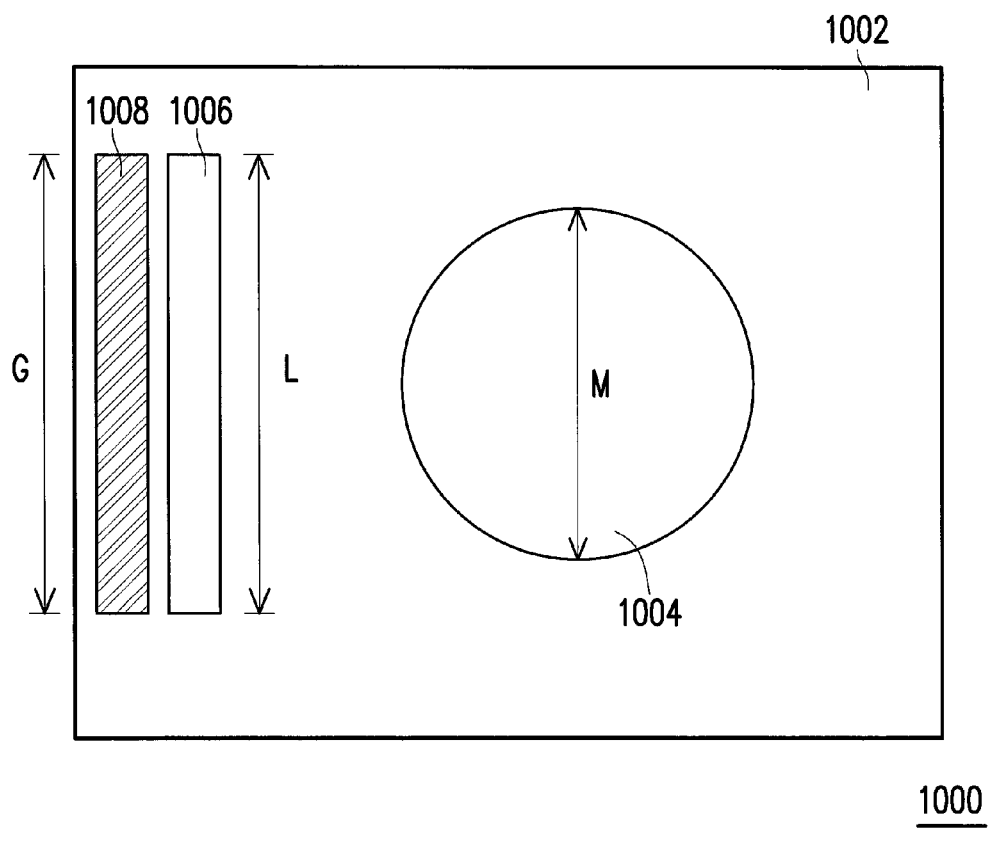
FIG. 10A is a schematic top views showing a coating system according to a third embodiment of the invention.
Figure 10B:
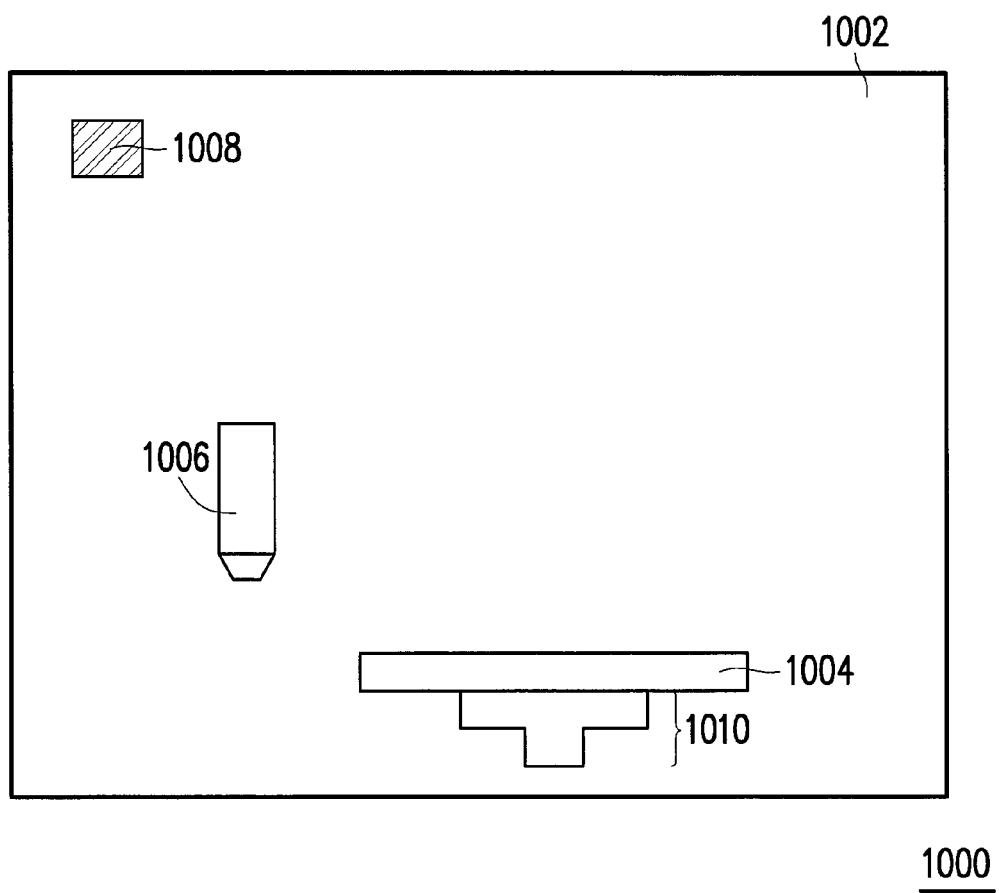
FIG. 10B is a schematic cross-sectional view of FIG. 10A.

FIG. 10A is a schematic top views showing a coating system according to a third embodiment of the invention, and FIG. 10B is a schematic cross-sectional view of FIG. 10A.

With reference to FIG. 10A and FIG. 10B, according to the third embodiment of the present invention, a coating system 1000 is provided. The coating system 1000 includes a chamber 1002, and a wafer 1004 is disposed therein. The wafer 1004 is supported by a supporting unit 1010. The wafer 1004, also referred as a substrate, may be a bare wafer or a wafer having a base material layer already formed thereon. A strip-shaped sprayer 1006 and a strip-shaped baking unit 1008 are disposed above the wafer 1004 in the chamber 1002. In addition, the strip-shaped baking unit 1008 is disposed higher than the strip-shaped sprayer 1006. The strip-shaped sprayer 1006 is used to spray a material and coat a material layer (not illustrated) over the wafer 1004. The material layer may be a photo resist layer, a BARC layer, an ODL layer, a SHB layer or a SOG layer. The strip-shaped baking unit 1008 is used to bake the material layer coated on the wafer 1004. The strip-shaped baking unit 1008 may be an infrared light source, for example. More particularly, the strip-shaped baking unit 1008 and the strip-shaped sprayer 1006 are disposed at the same side of the wafer 1004 and arranged parallel to each other. In addition, the length L of the strip-shaped sprayer 1006 and the length G of the strip-shaped baking unit 1008 are larger than a diameter M of the wafer 1004. In the coating system 1000, the coating process and the baking process can be in-situ performed (in the same chamber). The coating process and the baking process may be performed in sequence or in a specific order.

Figure 11A:
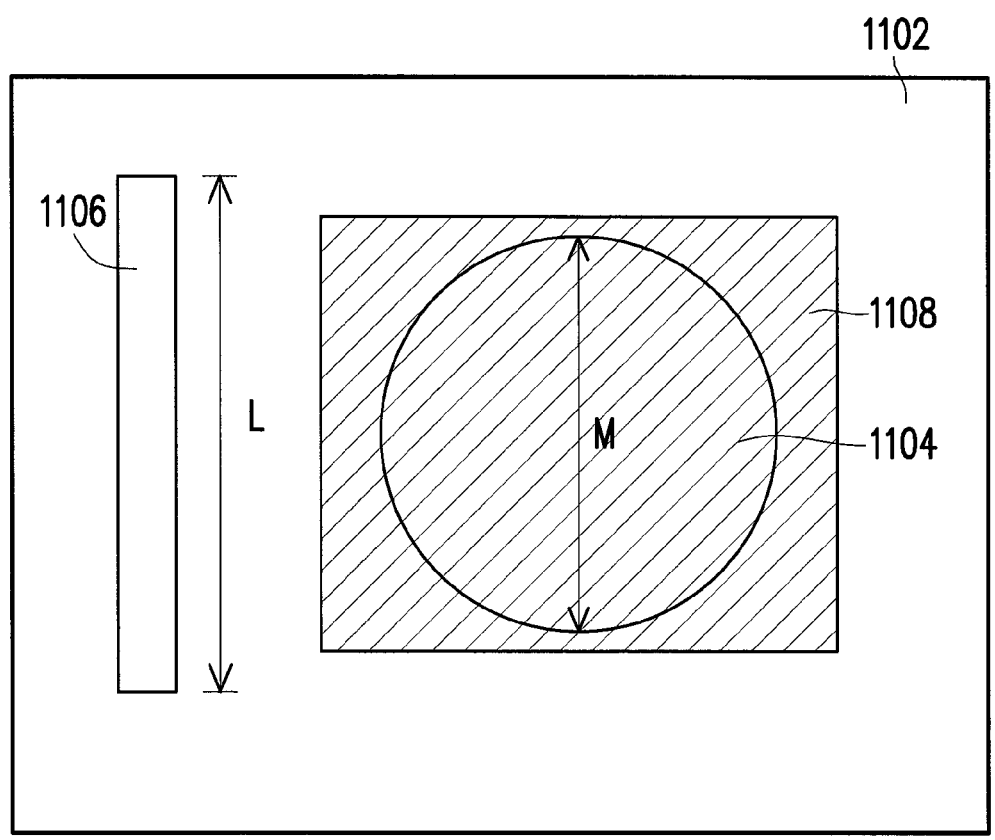
FIG. 11A is a schematic top views showing a coating system according to a fourth embodiment of the invention.
Figure 11B:
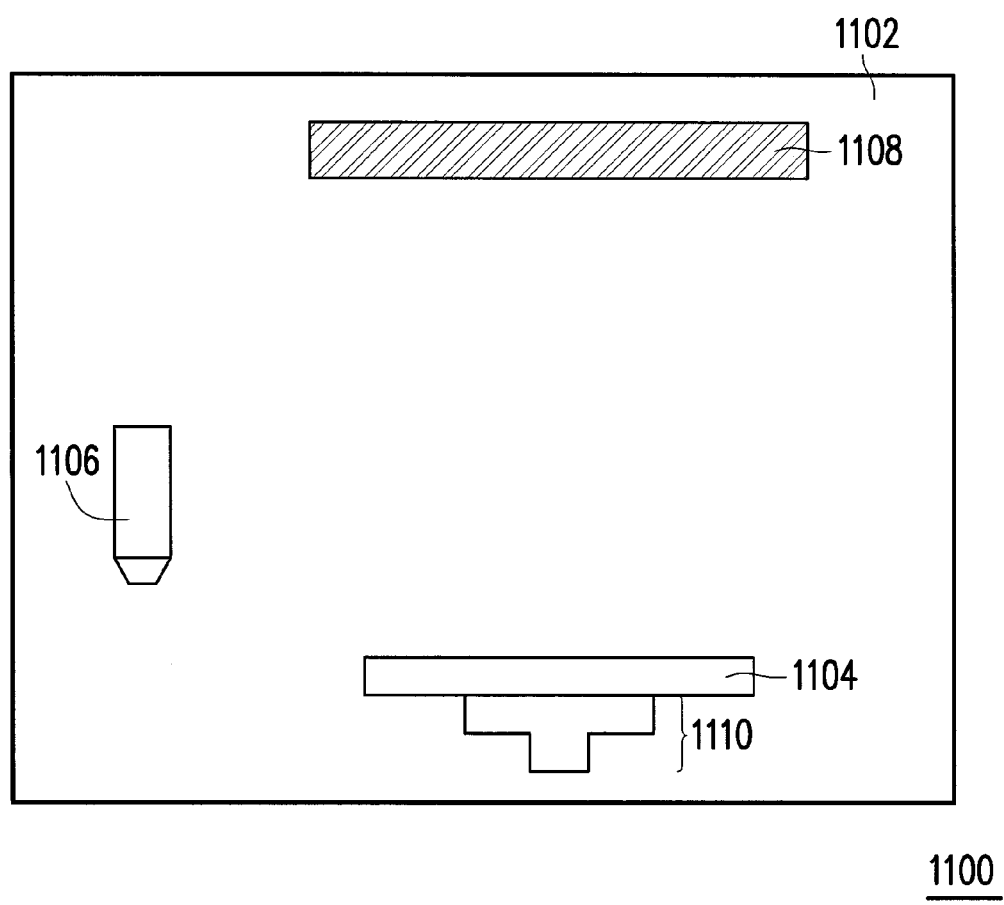
FIG. 11B is a schematic cross-sectional view of FIG. 11A.

FIG. 11A is a schematic top views showing a coating system according to a fourth embodiment of the invention, and FIG. 11B is a schematic cross-sectional view of FIG. 11A.

With reference to FIG. 11A and FIG. 11B, according to the fourth embodiment of the present invention, a coating system 1100 is provided. The coating system 1100 includes a chamber 1102, and a wafer 1104 is disposed therein. The wafer 1104 is supported by a supporting unit 1110. The wafer 1104, also referred as a substrate, may be a bare wafer or a wafer having a base material layer already formed thereon. With reference to FIG. 11A and FIG. 11B, a strip-shaped sprayer 1106 and a plate-shaped baking unit 1108 are disposed above the wafer 1104 in the chamber 1102. In addition, the plate-shaped baking unit 1108 is disposed higher than the strip-shaped sprayer 1106. The strip-shaped sprayer 1106 is used to spray a material and coat a material layer (not illustrated) over the wafer 1104. The material layer may be a photo resist layer, a BARC layer, an ODL layer, a SHB layer or a SOG layer. Besides, the length L of the strip-shaped sprayer 1106 is larger than a diameter M of the wafer 1104. The strip-shaped baking unit 1108 is used to bake the material layer coated on the wafer 1104. In addition, the size of the plate-shaped baking unit 1108 is larger than the size of the wafer 1104, so that the plate-shaped baking unit 1108 can cover the whole wafer 1104 for thorough baking. The plate-shaped baking unit 1108 may be an infrared light source, for example. More particularly, the plate-shaped baking unit 1108 remains stationary, and the baking process is controlled by turning on and then turning off the light source. In the coating system 1100, the coating process and the baking process can be in-situ performed (in the same chamber). The coating process and the baking process may be performed in sequence or in a specific order.

To sum up, according to the coating method of the invention, a strip-shaped sprayer is provided to evenly coat a material layer fully covering the wafer, especially for the wafer having a step structure or with a high step height therein, in order to improve the coating evenness and reduce the coating thickness variation. In addition, as the length of the strip-shaped sprayer is larger than a diameter of the wafer, the wafer-level coating method described herein can provide full coverage of a material layer over the wafer and better coating uniformity and enhanced pattern fidelity can be achieved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A coating method, comprising:
providing a wafer;
providing a strip-shaped sprayer above the wafer, wherein a length of the strip-shaped sprayer is larger than a diameter of the wafer;
performing a first coating process comprising spray a material from the strip-shaped sprayer to form a first material layer covering a top surface of the wafer and moving the strip-shaped sprayer relative to the wafer in a direction vertical to a length direction of the strip-shaped sprayer for at least a distance equal to or larger than the diameter of the wafer; and
stopping moving the strip-shaped sprayer and spraying the material after the first material layer is formed.

2. The coating method of claim 1, wherein the strip-shaped sprayer comprises a plurality of nozzle columns parallel to one another and each extending in the length direction of the strip-shaped sprayer.

3. The coating method of claim 2, wherein each of the plurality of nozzle columns comprises nozzles arranged as a column extending in the length direction of the strip-shaped sprayer, and the material is sprayed from the nozzles.

4. The coating method of claim 3, wherein the nozzles in different nozzle columns are not aligned to one another in the direction vertical to the length direction of the strip-shaped sprayer.

5. The coating method of claim 3, wherein in every two most adjacent nozzle columns, one nozzle column is shifted with a shifting distance relative to the other nozzle column in the length direction of the strip-shaped sprayer.

6. The coating method of claim 5, wherein the shifting distance is defined by the following equation:
t=(1/n)*P, wherein t is the shifting distance, n is a number of the nozzle columns and P is a pitch between every two most adjacent nozzles.

7. The coating method of claim 1, wherein the wafer comprises a step structure composed of at least one or more protrusion regions disposed on a flat region and there is a step height difference between a top surface of the protrusion region and a top surface of the flat region.

8. The coating method of claim 7, wherein the first material layer formed by the first coating process includes a slanting coverage portion formed on a side wall of the protrusion region.

9. The coating method of claim 7, wherein a transition distance of the slanting coverage portion is defined by the following equation:
T=H*tan(θ), wherein T is the transition distance of the slanting coverage portion, H is the step height difference of the protrusion region, and θ is an angle between a side wall of the protrusion region and an edge of a spraying reach of nozzles of the strip-shaped sprayer.

10. The coating method of claim 1, further comprising performing a second coating process after the first material layer is formed, to form a second material layer covering a top surface of the first material layer, and stopping the strip-shaped sprayer after the second material layer is formed.

11. The coating method of claim 10, wherein the second coating process comprising moving the strip-shaped sprayer backwards relative to the wafer in the direction vertical to the length direction of the strip-shaped sprayer for at least the distance equal to the diameter of the wafer, to spray a material which forms the second material layer.

12. The coating method of claim 11, further comprising repeating the first and second coating processes to form a plurality of material layers.

13. The coating method of claim 10, further comprising:
rotating the wafer a first degree before performing the first coating process,
rotating the wafer a second degree after the first material layer is formed; and
performing the second coating process.

14. The coating method of claim 10, wherein each of the first and second material layers is a photo resist layer, a BARC layer, an ODL layer, a SHB layer or a SOG layer.

15. The coating method of claim 1, further comprising rotating the wafer with a specific degree before performing the first coating process.

16. The coating method of claim 1, further comprising performing a baking process after stopping the strip-shaped sprayer.

17. The coating method of claim 16, wherein the baking process comprises:
- providing a strip-shaped baking unit extending along the direction vertical to the length direction of the strip-shaped sprayer;
- moving the strip-shaped baking unit relative to the wafer in the length direction of the strip-shaped sprayer to bake the material layer; and
- stopping the strip-shaped baking unit after moving the strip-shaped baking unit for at least the distance equal to the diameter of the wafer.

18. The coating method of claim 16, wherein the coating process and the baking process are performed in-situ.

19. The coating method of claim 1, further comprising removing an excess material after stopping the strip-shaped sprayer.

* * * * *